(12) United States Patent
Chyr

(10) Patent No.: US 6,770,499 B1
(45) Date of Patent: Aug. 3, 2004

(54) METHOD OF MAKING DBR GRATING

(75) Inventor: Yeong-Ning Chyr, Tucson, AZ (US)

(73) Assignee: Spectra Physics, Tucson, AZ (US)

( * ) Notice: Subject to any disclaimer, the term of this patent is extended or adjusted under 35 U.S.C. 154(b) by 0 days.

(21) Appl. No.: 10/625,415

(22) Filed: Jul. 23, 2003

(51) Int. Cl.$^7$ .............................................. H01L 21/00
(52) U.S. Cl. ........................... 438/32; 430/321; 372/47; 372/96
(58) Field of Search ........................... 372/47; 430/321; 438/32, 47, 57

(56) References Cited

U.S. PATENT DOCUMENTS 5,817,537 A * 10/1998 Bodere et al. ................. 438/32
6,344,367 B1 * 2/2002 Naya et al. .................... 438/32

OTHER PUBLICATIONS

R. G. Hunsperger "Integrated Optics" Theory and Technology 3d edition, Springer Verlag, pp. 228–229.

* cited by examiner

*Primary Examiner*—Alonzo Chambliss
*Assistant Examiner*—Asok Kumar Sarkar
(74) *Attorney, Agent, or Firm*—Howard R. Popper

(57) ABSTRACT

A DBR grating may be created in the cladding of a wafer by defining a non-gain window area, advantageously at the end of the wafer. The non-gain area may be defined either by removing all layers above the cladding layer at the window portion or, preferably, by halting the MOCVD process once the cladding layer has been created and by selectively removing from a portion of the cladding layer a protective coating, advantageously of $SiO_2$, $Si_3N_4$, or a metal, to define the window area. A photo resist is applied, and the wafer is exposed to interfering laser beams to create a grating pattern in the photoresist, conveniently without the need for any particular effort to confine either the photoresist or the interfering beams solely to the window area. The photoresist is developed and an etchant used to transfer the pattern into the cladding layer. The protective layer is then removed and non-gain layers may be laid down in the usual manner, the protective layer having prevented the grating pattern from being created anywhere but in the window area.

10 Claims, 6 Drawing Sheets

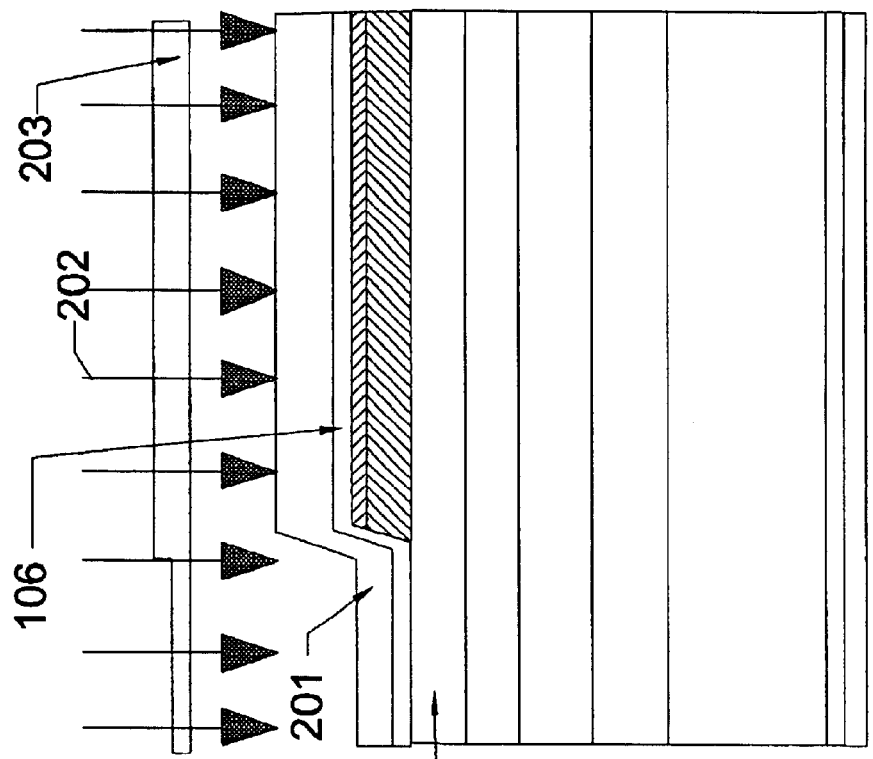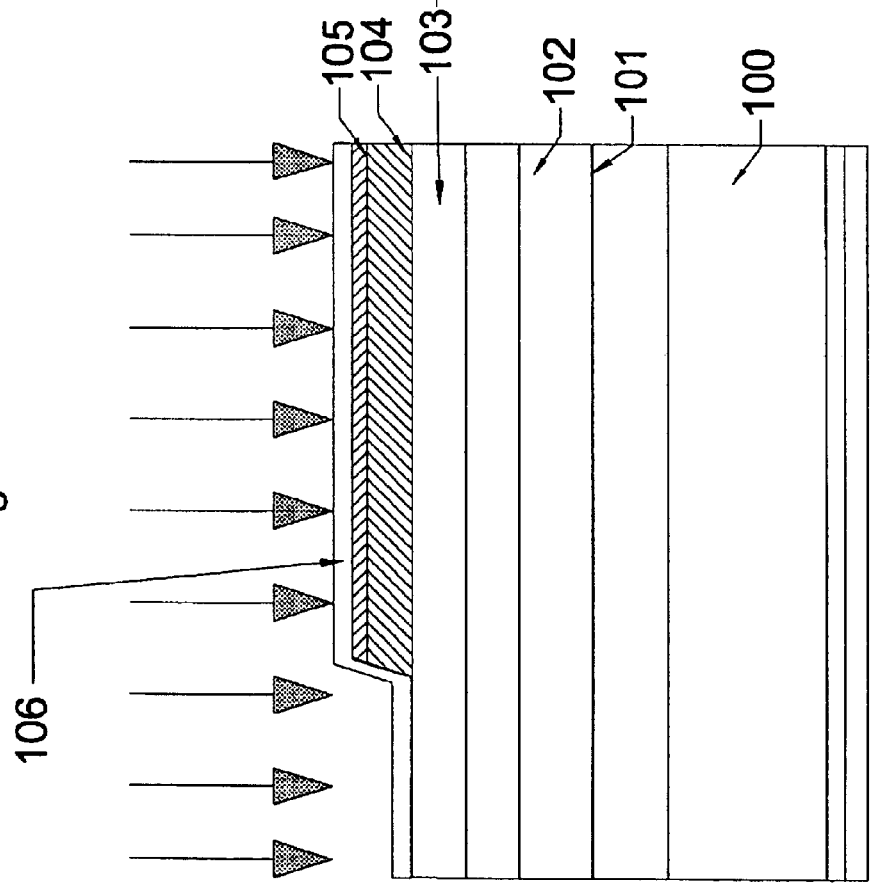

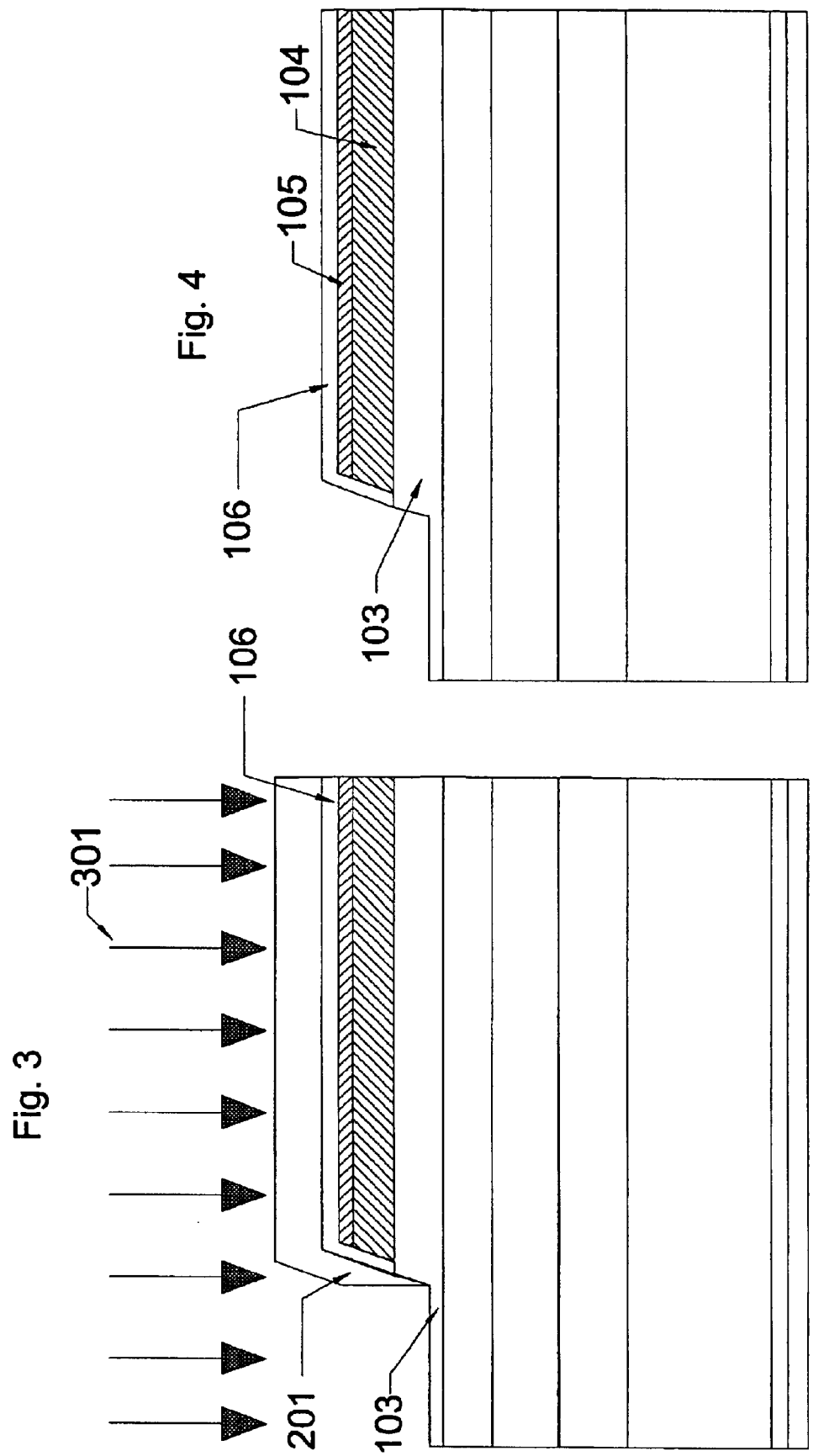

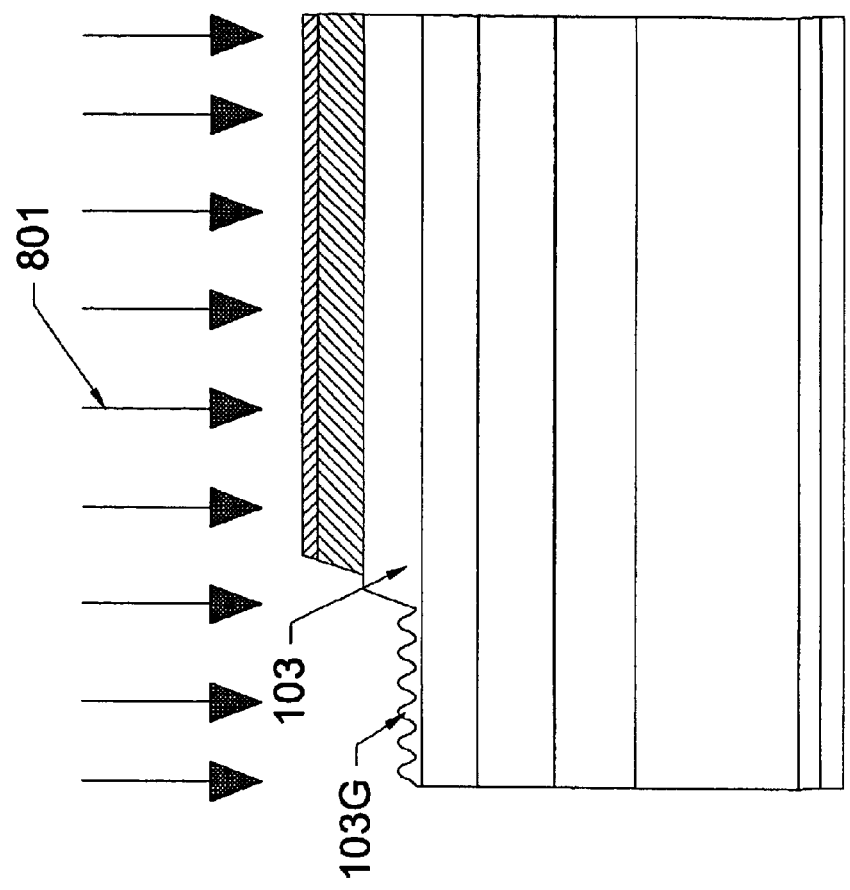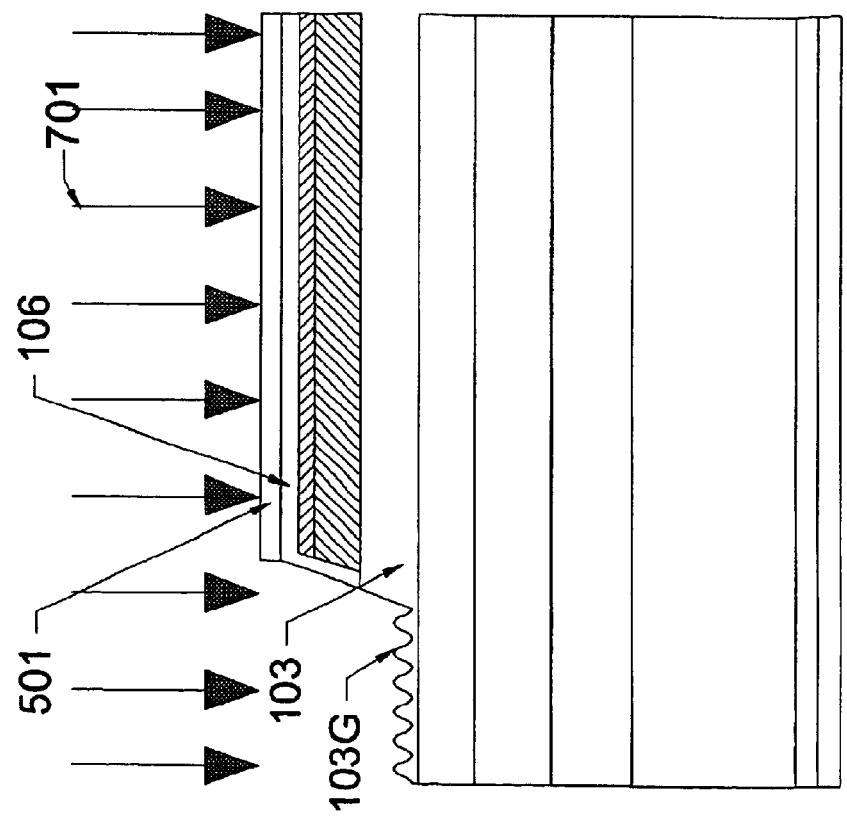

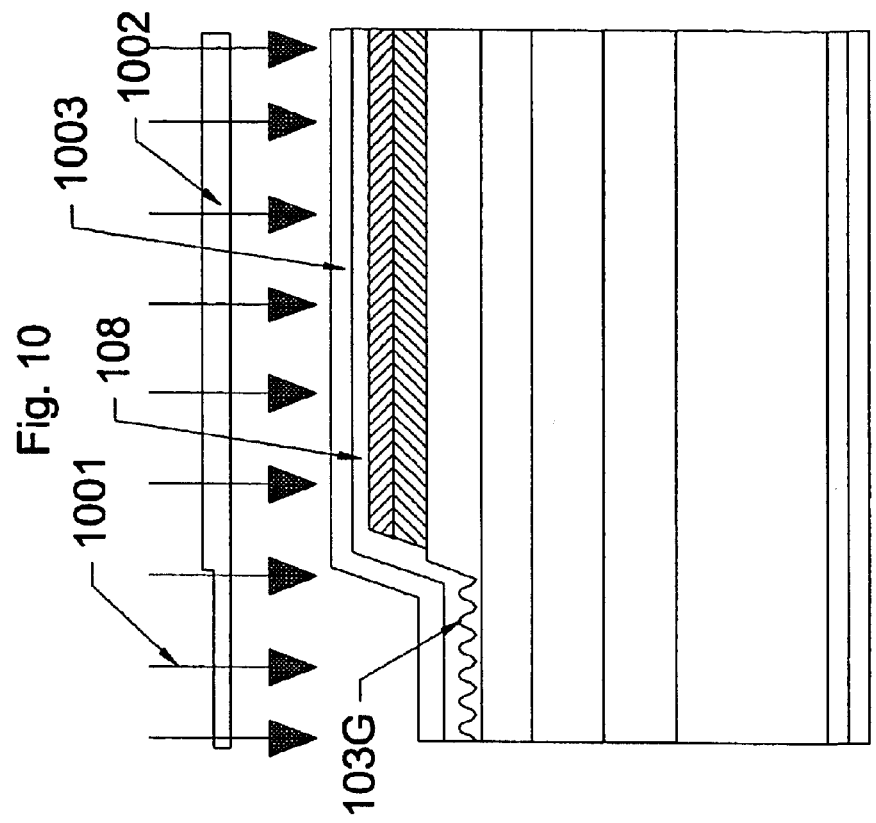
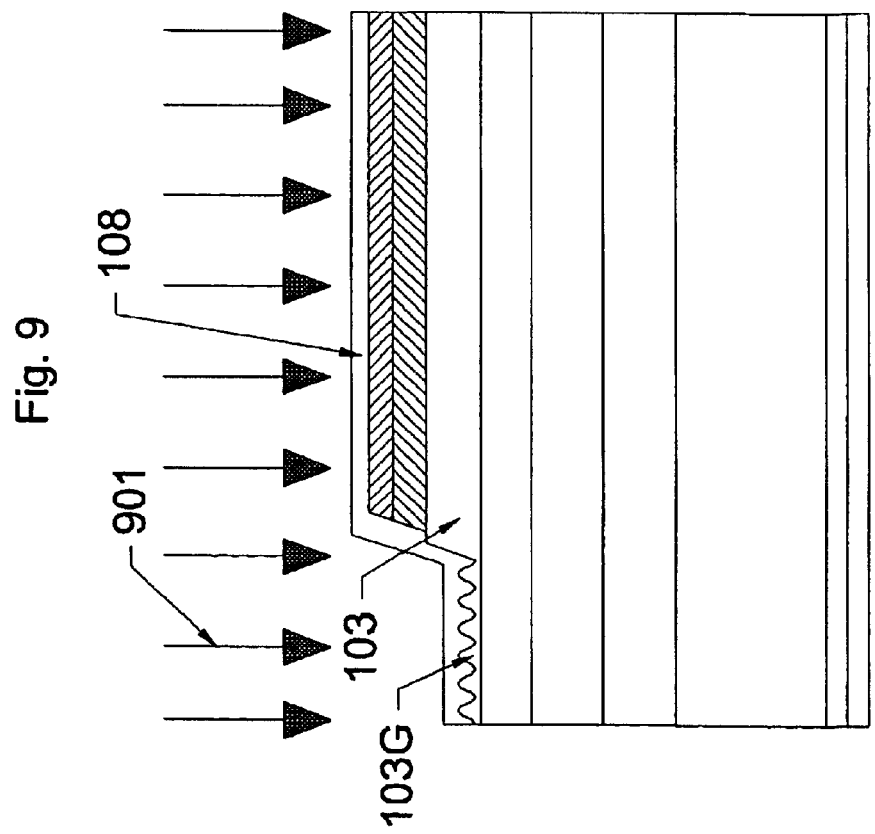

METHOD OF MAKING DBR GRATING

FIELD OF THE INVENTION

This invention relates to longitudinal mode laser diodes and, more particularly, to laser diodes employing gain-stabilizing feedback by locating a first or second-order grating of suitable pitch externally to the gain region of the solid state structure, more commonly known as DBR lasers.

BACKGROUND OF THE PRIOR ART

In a co-pending application entitled "Increasing the Yield of Precise Wavelength Lasers", assigned to the assignee of the present application, Ser. No. 10/227,033 filed Aug. 23, 2002, a laser device is disclosed in which a short, second-order grating was etched into a semiconductor lying in an unpumped region beyond the end of the gain stripe. Because the short grating was located beyond the end of the gain stripe it was not necessary to cover the grating with gain-providing epitaxial layers which require a contaminant-free surface. The layer in which the grating was etched was located at a distance sufficiently remote from the high intensity optical field of the waveguide to provide just enough feedback to reduce the gain at an unwanted wavelength ($\lambda 2$) and yet was sufficient to support oscillation at a desired wavelength ($\lambda 1$) without incurring excessive surface diffraction loss. Since the short grating was one-tenth the length of Fabry-Perot cavity, the diffraction coefficient, $\alpha$, was required to be ten times larger than when a full-length DFB grating is employed, e.g., $\alpha \approx 1.0 \text{ cm}^{-1}$. This held the fraction of power lost to surface diffraction radiation to about 1%, which is sufficient to provide stabilizing feedback without sapping too much energy from the longitudinal beam.

As described in the aforementioned application, the surface grating was produced after the wafer, containing most of the many conventional layers, had been fabricated. The wafer was coated with a first, fairly thick photoresist and exposed to light through a mask to define a window area, preferably at the end of the wafer where the grating to be formed would have the least possibility of influencing the optical gain. Development of the photoresist removed it from the window area, but left the remainder of the wafer covered. An etchant applied to the wafer to removed layers above the cladding layer at the defined window. A second, thinner photoresist was then applied and exposed to a holographic pattern of interfering laser beams to form ¼ micron fine periodic grating pattern. The photoresist was developed and gas plasma etching was employed to transfer the grating pattern into the cladding layer. It was thought that the rest of the wafer which remained covered with the thick photoresist would be protected against the plasma etching. After the grating was formed in the cladding layer, a layer of $SiO_2$ was applied to the entire wafer and selectively removed to permit metal deposition of electrical contacts that would define the gain stripe area.

Unfortunately, it was found that the use of the two-photoresist process did not sufficiently confine the grating to the region at the end of the mesa, the use of a thin photoresist apparently not being completely benign with respect to the underlying thick photoresist. The grating pattern which was desired only at the end of the wafer also tended to be produced over the entire surface area leading to unwanted feedback effects.

SUMMARY OF THE INVENTION

A DBR grating may be created in the cladding layer of a wafer by defining a window area, advantageously at the end of the wafer such that the DBR grating created in the window area would have minimal effect on optical gain. The grating window area is preferably defined at the end of the wafer after most of the wafer's layers have been produced by the usual MOCVD process. All layers above the cladding layer are then removed in the window area. Alternatively, the grating area could be defined by halting the MOCVD process after only the cladding layer has been laid down and by overgrowth of the remaining layers, although overgrowth of gain layers upon an etched layer is somewhat difficult in a production environment. In either case, a protective coating, advantageously of $SiO_2$, $Si_3N_4$, or a metal selectively is then applied to the wafer and selectively removed from the window area. A thin photo resist is applied to the entire wafer which is then exposed to interfering laser beams. While the grating pattern is created throughout the photoresist, the protective coating underneath the photoresist prevents the subsequent etching that transfers the pattern into the window area at the end of the wafer from being etched into the remainder of the wafer, without the need for any particular effort to confine either the photoresist or the interfering beams solely to the window area. The protective layer is then removed and other layers may be laid down in the usual manner.

BRIEF DESCRIPTION OF THE DRAWING

The foregoing and other objects and features of the present invention may become more apparent from a reading of the ensuing description together with the drawing, in which:

FIGS. 1 through 6 are side views of the wafer that delineate the process steps for defining a DBR grating in the cladding layer at the end of the wafer without creating a DFB grating elsewhere on the wafer; and FIGS. 7 through 12 are further side views that delineate the process steps for completing the layers above the cladding layer.

DESCRIPTION

Figure 6:
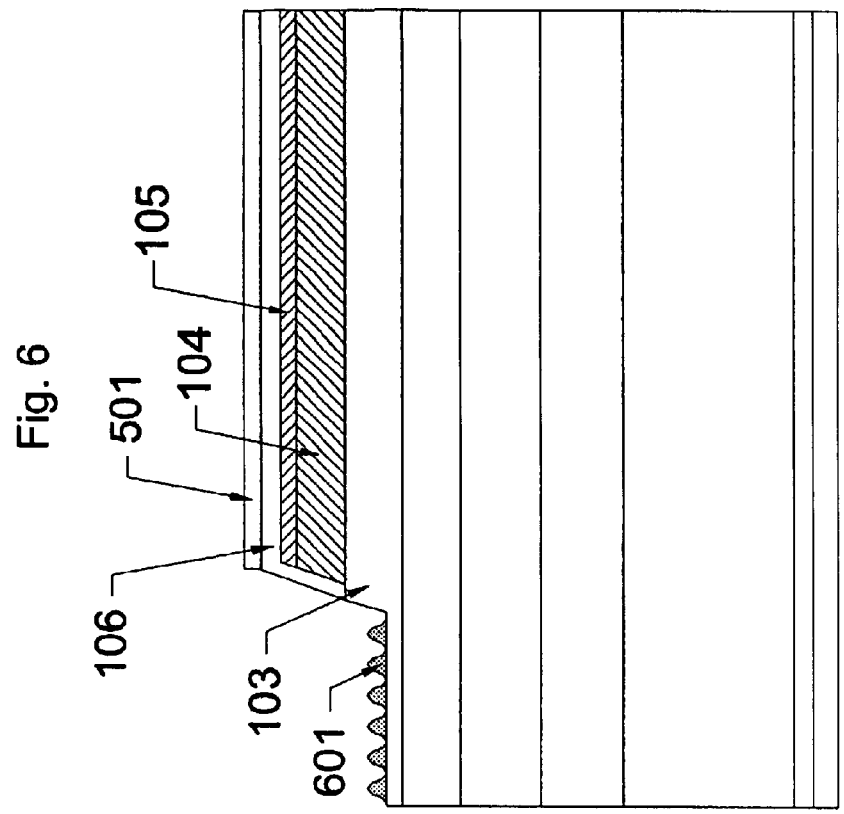

Referring to FIG. 1, a wafer for making a semiconductor laser is typically made up of a number of layers produced by an MOCVD process upon a substrate layer 100. The wafer will include a quantum well 101, a waveguide layer 102, a confinement layer 102 and a P-side cladding layer 103. Above cladding layer 103, are an intermediate layer 104 and a cap layer 105. Some of these layers may be etched away to define a central mesa which will define the optical gain mechanism of the laser.

In accordance with the principles of the present invention, there are two ways in which a DBR grating may be produced in an area of the wafer, most conveniently at the end of the wafer, where it will have minimal effect on the optical gain mechanism of the laser, without creating a DFB grating elsewhere on the wafer.

In the preferred method, one starts with a wafer that contains all or most of the usual layers, including layers of the central mesa, as outlined above. Then, at the end of the wafer, all of the layers above the cladding layer 103 are removed to form a "window" into cladding layer 103 in which the DBR grating will be created and a protective layer 106, preferably of $SiO_2$, is laid down by PECVD over the entire the wafer.

In FIG. 2, a photoresist 201 is applied, and the wafer is exposed to light beams 202 through a mask 203 which exposes the window area at the end of the wafer. Photoresist 201 is developed and, in FIG. 3, etchants 301 are applied to remove protective coating 106 and some of cladding layer 103 from the window area, the remaining portion of the wafer being protected by photoresist 201.

In FIG. 4 the remaining photoresist 201 has been removed.

Figure 5:
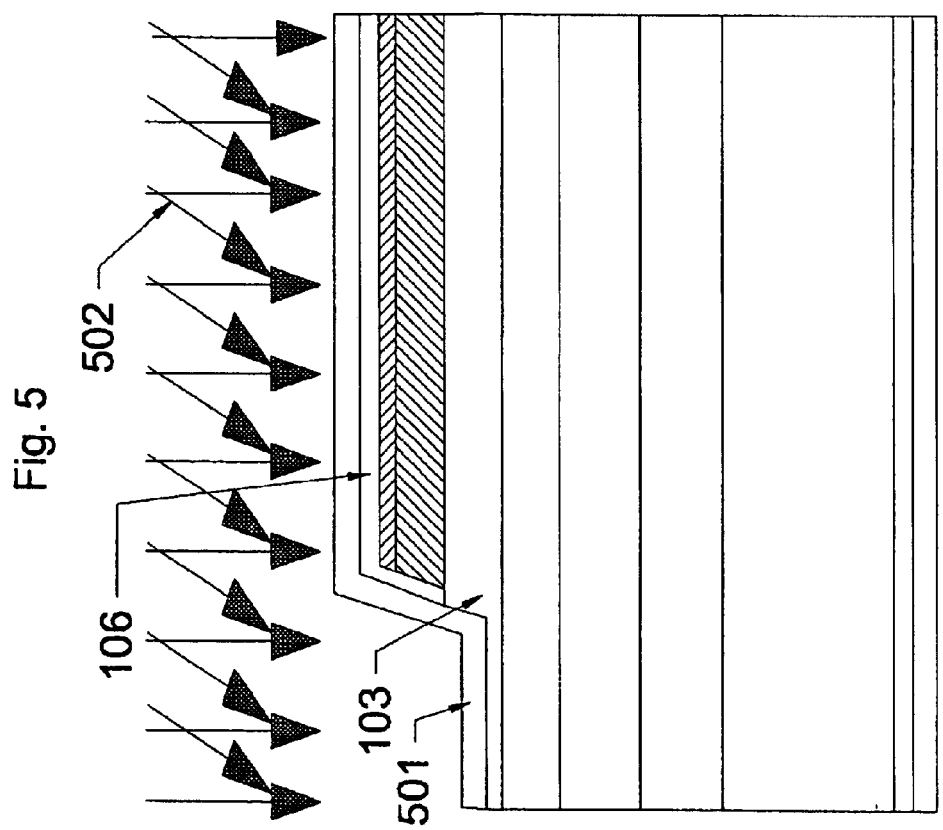

In FIG. 5, the wafer is coated with a thin photoresist 501 and exposed to interfering holographic laser beams 502 to create a grating pattern in photoresist 501, conveniently without the need for any particular effort to confine either the photoresist or the interfering beams solely to the window area. Advantageously the interfering beams may be provided by an argon laser, typically at 458 nm, to define the grating pattern in photoresist 501.

In FIG. 6 photoresist 501 is developed leaving a grating pattern 601.

From the developed photoresist 501, plasma etching, illustratively with $SF_6$, is employed in FIG. 7 to widen the developed photoresist 501 in the grating window to allow $SiCl_4$ to transfer pattern 601 into cladding layer 103 as grating 103G. Alternatively, $SF_6$ could be replaced by another etchant such as $CCl_2F_2$, $CClF_3$ or $CF_4$ and $SiCl_4$ could be replaced by another etchant such as $BCl_3$.

In FIG. 8, wet etchants are applied to remove protective layer 106, layer 106 having prevented the grating pattern from being created anywhere but in the window area.

In FIGS. 9 through 12 other layers may be laid down.

It will be recalled that, in FIG. 1, a protective layer 106 was laid down over the entire wafer surface but coating 106 was removed from the left-hand portion of the wafer by the process steps of FIGS. 2 and 3. It is an aspect of the present embodiment that the index of refraction of photoresist 501 should by greater than the refractive index of protective coating 106 so that the holographic light penetrating photoresist 501 will undergo two 90° phase reversal as it encounters and is refracted by protective layer 106. This results in cancellation of the interference pattern in the photoresist 501 over the wafer, except in the window area where there will be no such cancellation and therefore a DBR grating will be produced in the window area. Thus, as shown in FIG. 6, when photoresist 501 is developed, the grating interference patter 601 will be fixed in only the window portion of the photoresist.

In FIG. 8, the protective layer 106 was removed from the remaining portion of the wafer so that when, in FIG. 9, an $SiO_2$ layer 108 is laid down over the entire wafer surface, the resulting layer 108 will be of uniform thickness. Layer 108 covers the grating 103G with $SiO_2$.

Figure 11:
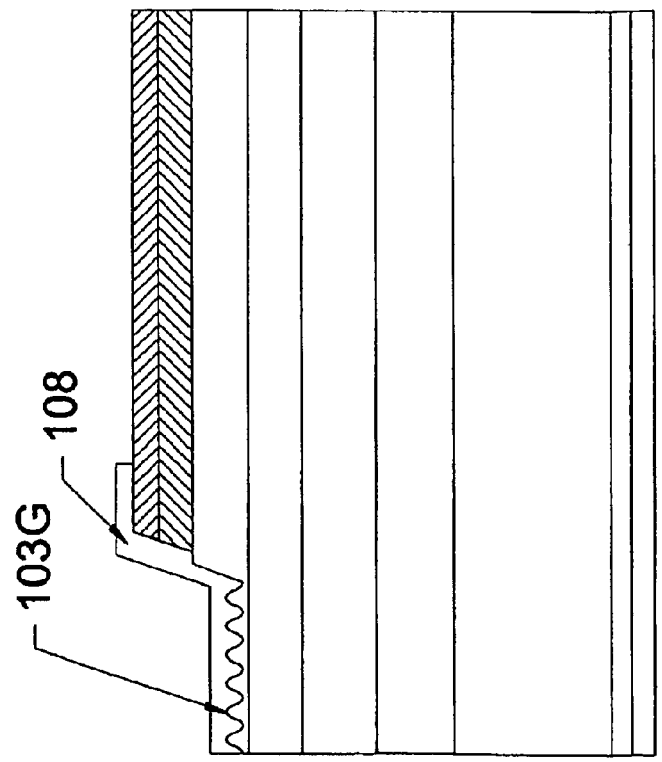

In FIG. 10 photoresist 1003 is applied and exposed to light 1001 through a contact layer mask 1002 to define an area on the wafer to which contact metal will be applied after a portion of $SiO_2$ layer 108 is removed. In FIG. 11 wet etchants (not shown but preferably BOE) have been applied to remove a portion of $SiO_2$ layer 108 over a portion of the wafer to which a metal contact layer will be applied.

Figure 12:
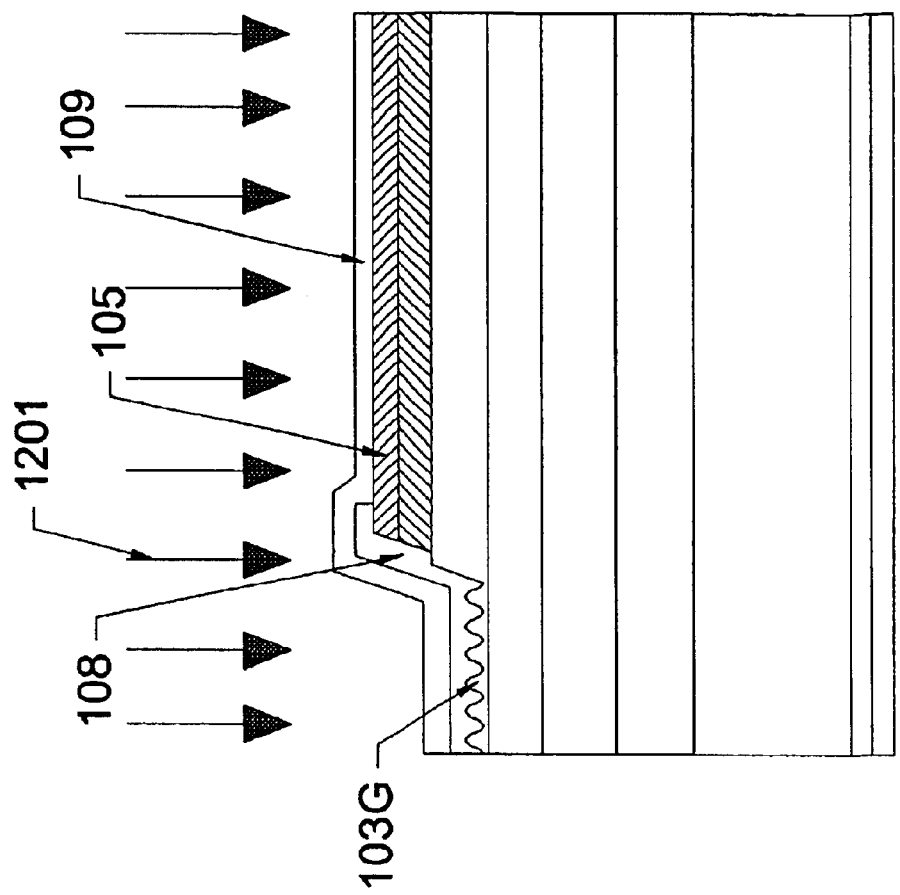

In FIG. 12 P-metal 1201 is applied to form a P-contact layer 109 on the wafer, thus completing the process steps for the P-side of the wafer. Thereafter the bottom of the wafer will be subjected to conventional lapping and polishing to facilitate deposition of an N-metal contact (not shown), thereby completing wafer fabrication. Following wafer fabrication the wafer will be cleaved to provide facets for defining a Fabry-Perot cavity for laser operation.

What has been shown is deemed to be illustrative of the principles of the invention. Further and other modifications will be apparent to those skilled in the art and may be made without, however, departing from the spirit and scope of the invention.

What is claimed is:

1. A method of processing a semiconductor wafer having a plurality of epitaxial layers, including a P-side cladding layer adjacent to a waveguide layer, so as to create a distributed Bragg reflecting (DBR) grating in a defined window area without creating a distributed feedback (DFB) grating over the remainder of the wafer, comprising the steps of:

depositing a protective layer over said wafer;

removing said protective layer over a portion of said cladding layer to define a window in an area of said wafer having negligible optical gain;

applying a photoresist over said wafer including said window area;

exposing said entire photoresist to interfering laser beams to create a grating pattern in said photoresist;

transferring said grating pattern into said cladding layer at said window area; and removing the remainder of said protective layer prior to depositing additional layers of said wafer.

2. The method of claim 1 wherein said protective layer is selected from the group consisting of SiO2, $Si_3N_4$ and a metal.

3. The method of claim 1 wherein said photoresist is removed prior to transferring said grating pattern into said cladding layer.

4. The method of claim 3 wherein a photoresist is exposed to said interfering laser holography beams provided from an argon laser.

5. The method of claim 4 wherein argon laser is operated at a wavelength of 458 nm.

6. The method of claim 5 wherein after said photoresist is removed using an etchant selected from the group consisting of $SF_6$, $CCl_2F_2$, $CClF_3$ and $CF_4$.

7. The method of claim 6 wherein after said photoresist is removed, an etchant selected from the group consisting of $SiCl_4$ or $BCl_3$ is used to transfer said pattern into said cladding layer.

8. The method of claim 1 wherein said protective layer has a refractive index—different than the refractive index of said photoresist to cancel said interfering laser beams over said protective layer.

9. The method of claim 1 wherein said additional layers include gain layers beyond said window area.

10. The method of claim 1 wherein said additional layers include non-gain layers over said window area.

* * * * *